(12) United States Patent
Berry et al.

(10) Patent No.: US 7,820,490 B2
(45) Date of Patent: Oct. 26, 2010

(54) METHOD FOR LTCC CIRCUITRY

(75) Inventors: Cynthia W. Berry, Pasadena, MD (US); Alex E. Bailey, Hampstead, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 831 days.

(21) Appl. No.: 11/450,417

(22) Filed: Jun. 12, 2006

(65) Prior Publication Data

US 2006/0236533 A1    Oct. 26, 2006

Related U.S. Application Data

(62) Division of application No. 10/786,125, filed on Feb. 26, 2004, now abandoned.

(51) Int. Cl.
*H01L 29/74*    (2006.01)
(52) U.S. Cl. .................... 438/125; 257/E23.16
(58) Field of Classification Search .......... 438/125; 257/E23.16
See application file for complete search history.

(56) References Cited

U.S. PATENT DOCUMENTS 6,419,980 B1 *  7/2002  Auerswald .............. 427/97.4
6,528,875 B1    3/2003  Glenn et al.
6,698,084 B2    3/2004  Uchikoba \* cited by examiner

*Primary Examiner*—Lynne A Gurley
*Assistant Examiner*—Samuel A Gebremariam
(74) *Attorney, Agent, or Firm*—Andrews Kurth LLP

(57) ABSTRACT

An LTCC (low temperature cofired ceramic) structure which has conductors to which leads are to be bonded for connection to external circuitry. The conductors include additives to promote adhesion to the ceramic layer. The presence of these additives degrade bonding performance. For better bondability of the leads, a pure conductor metal layer, devoid of the additives is placed on the conductors in areas where leads are to be bonded. This pure conductor metal layer may be cofired with the stack of ceramic layers or may be post fired after stack firing.

12 Claims, 2 Drawing Sheets

METHOD FOR LTCC CIRCUITRY

This application is a Divisional of application Ser. No. 10/786,125, filed on Feb. 26, 2004, now abandoned the entire contents of which are hereby incorporated by reference and for which priority is claimed under 35 U.S.C. §120.

STATEMENT OF GOVERNMENT INTEREST

This invention was made with Government support under Contract F33657-97-LTCC-0030 awarded by the Department of Defense. The Government has certain rights in the invention.

BACKGROUND OF THE INVENTION

1. Field of the Invention

The invention in general relates to the field of LTCC (low temperature cofired ceramic) circuitry.

2. Description of Related Art

An LTCC circuit is comprised of a plurality of ceramic layers with passive and/or active components and stacked together to form a module, with each ceramic layer containing thick film printed circuitry metallization, generally gold or silver. The ceramic layers include conductive vias for making electrical contact between layers and the ceramic layers are cofired at a temperature high enough to sinter the layers, yet low enough so as prevent flowing or melting of the metallization. The result of the firing is to form a rigid monolithic structure.

LTCC circuits have high packing density, can be customized to meet desired applications, are cost effective, reliable and can be controlled with respect to dielectric values. The LTCC allows for integration of digital and RF, stripline and microstrip circuits in a single light weight 3-D package. Such LTCC circuits are used for high frequency applications in both military as well as commercial devices.

In order to electrically connect the LTCC structure to other circuitry, wire or ribbon leads are bonded to conductors on the surface of the structure for connection to the other circuitry. A problem often arises however in that the bonded leads may form a poor contact with, or pull loose from, the conductors. This is due to the fact that the conductors contain one or more additives to promote conductor adhesion to the ceramic base layer and it is these additives which degrade the bonding of the leads.

It is therefore a primary object of the present invention to provide a low temperature co-fired ceramic (LTCC) structure with much improved lead bondability.

SUMMARY OF THE INVENTION

An LTCC structure in accordance with the present invention consists of a plurality of stacked layers of ceramic material including metallization in predetermined patterns on and through the layers. The stacked layers include a plurality of exposed electrical conductors to which leads are to be bonded. The conductors are of a metal which includes one or more additives to promote adhesion to the ceramic layer on which the conductors are deposited. A bonding metal layer is deposited on top of the conductors at predetermined locations and is of the same metal as the conductors, however devoid of the one or more additives. The leads are then bonded to the bonding metal layer for improved bonding performance.

The bonding metal layer may be deposited and may be cofired with the stack of ceramic layers. Alternatively, the stack may be cofired and the bonding metal layer subsequently deposited and thereafter be fired in a second firing of the stack.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1A:
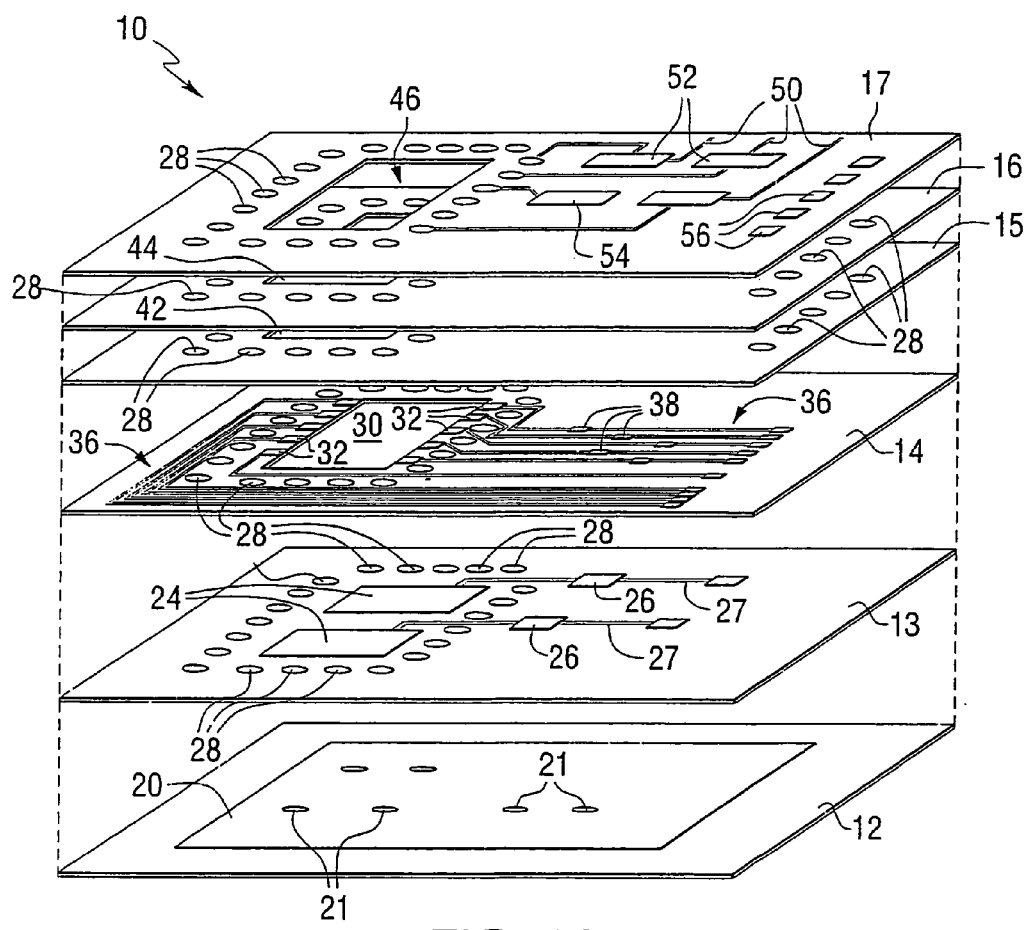
FIG. 1A is an exploded view of an LTCC structure.
Figure 1B:
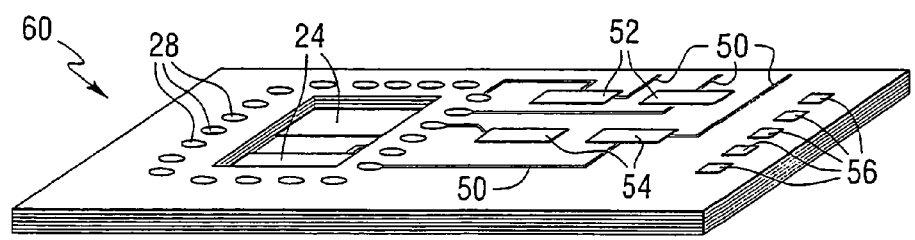
FIG. 1B illustrates the structure of FIG. 1A in a fired modular form.

Referring now to FIG. 1, there is illustrated an LTCC structure 10 which is comprised of a plurality of ceramic layers 12 to 17, each having a pattern of metallization. It is to be noted that structure 10 does not represent an actual circuit but is presented to show typical components which may be placed on the individual ceramic layers. Further, in the description to follow, the metallization will be described using gold, by way of example.

Bottom layer 12 includes a ground plane 20 having voids 21 where a ground plane is not desired. Layer 13 has metallization areas 24 for the mounting of active devices (not shown), and connected to passive devices such as capacitors 26 by means of conductors 27. Surrounding metallization areas 24 are vias 28 which are vertical apertures in the layer, filled with a specially formulated conductive material for making electrical contact with components on different layers.

Layer 14 includes an opening, or cavity, 30 to accommodate any active devices on metallization areas 24 on the previous layer, and includes a plurality of conductor pads 32 to which leads from those active devices will be connected. In addition to vias 28, layer 14 also illustrates conductors 36, some of which include passive devices in the form of resistors 38. The next two layers 15 and 16 both include vias 28 and respective cavities 42 and 44, providing access to the active devices.

The top, or surface layer 17 includes cavity 46 and vias 28 to which are connected various conductors 50. Some conductors 50 include resistors 52 in their path while other conductors 50 include metallization areas 54 for placement of active devices. Further, layer 17 illustrates a plurality of conductor pads 56, connected to components on a previous layer or layers and to which will be connected leads for connection to other circuitry in a system. Similarly, various conductors 50 will also be used for this purpose.

In the manufacture of the LTCC structure 10, sections of green (unfired) ceramic tape of an appropriate size for processing are cut from a larger roll. Vias are formed, such as by a punching process and filled with the conductive material. The conductors including the conductor pads are applied in desired patterns by a process using patterned screens to which are applied gold paste.

In order that the gold paste conductor pattern is suitably affixed to the ceramic tape layer, the gold paste includes one or more additives to promote adhesion. Such additives commonly used include copper, bismuth and glass, by way of example, depending upon the formulation of the ceramic material. Any cavities are then formed in appropriate layers, which are then stacked and fired at a temperature of around 850° C. to sinter the gold paste and ceramic layers to form the solid unitary module 60 shown in FIG. 1B.

After firing, leads are bonded to cavity and surface conductors so that the module 60 may be connected to other circuitry of a system. These leads, which may be wires or ribbons, for example, are bonded to the conductors by a process which includes both heat and ultrasonic vibration. A problem arises however, in that, at times, the leads are poorly bonded and eventually come loose, or do not initially bond at all. This may be attributed to the additives which are included in the conductor paste to promote adhesion to the ceramic layer. It is these additives which prevent optimal bonding.

The present invention obviates this problem by adding a bonding layer of the same metal as the conductor, only in a pure state devoid of any of the additives contained in the conductor. In one embodiment, this bonding layer may be applied to the conductors in a limited bonding area, prior to firing and then be cofired along with the stack of ceramic layers. In a second embodiment the bonding layer may be applied to the conductors in a limited bonding area and may be post fired after the initial firing of the stack of ceramic layers. Any such bonding layer to be applied to conductors on intermediate ceramic layers (such as conductor pads 32 on layer 14 in FIG. 1A) would have to use the cofired option.

Figure 2:
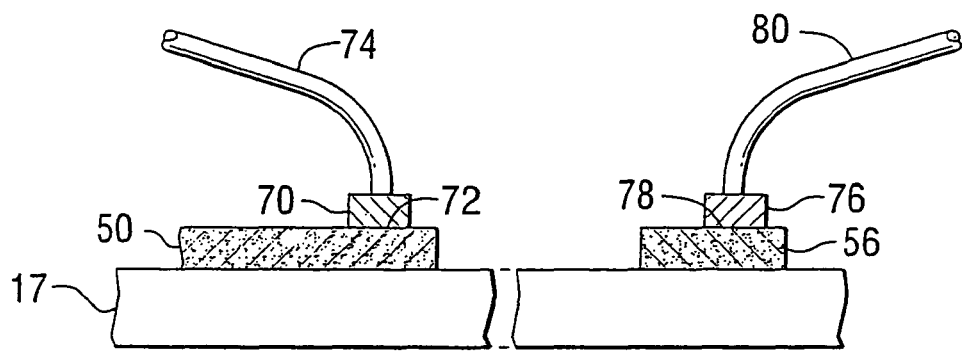
FIG. 2 is a cross-sectional view through conductors of the structure of FIG. 1, illustrating an embodiment of the present invention.

FIG. 2 illustrates a portion of ceramic layer 17, together with a typical gold conductor 50 and gold conductor pad 56, both containing additives for better adhesion to the ceramic under layer 17. In accordance with the present invention, a bonding layer 70 is affixed to a limited bonding area 72 on top of conductor 50 such as by the same screening process for depositing the conductor. Bonding layer 70 is of pure gold devoid of any of the additives contained in conductor 50 and receives wire or ribbon lead 74, attached by the conventional process of heat and vibration, or thermosonic, bonding. The absence of the additives ensures for a positive and strong bond, coupled with good electrical contact to the conductor 50.

In a similar fashion, bonding layer 76, also of pure gold devoid of any additives, is affixed to a limited bonding area 78 on conductor pad 56 to ensure for a strong bond with lead 89.

Figure 3:
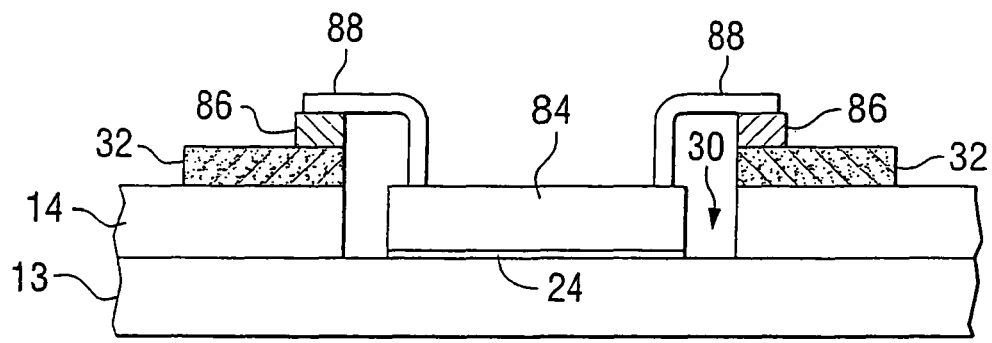
FIG. 3 is a view of an active device on an intermediate layer of the LTCC structure.

FIG. 3 illustrates the application of the present invention to an intermediate ceramic layer. An active device 84 affixed to metallization area 24 on ceramic layer 13 and extends through cavity 30. Respective bonding layers 86 have been applied to conductor pads 32 and have been cofired with the stack of ceramic layers. Leads 88 of active device 84 are securely bonded to the pure gold bonding layers 86 by thermosonic bonding.

In actual tests of LTCC lead bonds, the present invention provided improved bondability that were from 10% to 20% stronger than conventional techniques. Further, in some instances of prior art bonding, the leads would not even bond to the conductors, leading to a "no stick" situation. The present invention may reduce such no sticks by as much as 50%.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of making an LTCC structure, comprising the steps of:
   providing a plurality of ceramic layers to be stacked together to form a module;
   applying to a plurality of said plurality of ceramic layers, prior to said stacking, conductor patterns of a metal containing one or more additives to promote adhesion of said conductor patterns to said plurality of ceramic layers, wherein said conductor patterns include areas of exposed conductors to which leads will be bonded;
   applying to said areas of exposed conductors to which leads will be bonded said same metal, as the metal of said conductor patterns, devoid of said additives, to form a bonding layer at said areas;
   stacking and firing said plurality of ceramic layers to form said module;
   bonding said leads to said bonding layer on said exposed conductors.

2. A method according to claim 1 which includes:
   providing predetermined ones of said plurality of ceramic layers with cavities such that some of said exposed conductors are on a layer other than a surface layer, and are accessible through said cavities for lead bonding.

3. A method of making an LTCC structure, comprising the steps of:
   providing a plurality of ceramic layers to be stacked together to from a module;
   applying to a plurality of said plurality of ceramic layers, prior to said stacking, conductor patterns of a metal containing one or more additives to promote adhesion of said conductor patterns to said plurality of ceramic layers, wherein said conductor patterns include areas of conductors to which leads will be bonded;
   stacking and firing said plurality of ceramic layers to form said modules;
   applying to said areas of conductors, on a surface layer, to which leads will be bonded, said same metal, as the metal of said conductor patterns, devoid of said additives, to form a bonding layer at said areas;
   firing said stack a second time;
   bonding said leads to said bonding layer.

4. A method of making a co-fired, multi-layer laminate ceramic structures comprising the steps of:
   applying metallization in predetermined conductor patterns on and through a plurality of stacked co-fired layers of a predetermined type of ceramic material on said plurality of stacked co-fired layers, wherein said conductor patterns include a plurality of electrical conductors including leads;
   exposing said plurality of electrical conductors including said leads from said conductor patterns at predetermined locations on said plurality of stacked co-fired layers;
   said electrical conductors being comprised of a metal paste including one or more additives to promote adhesion to said plurality of stacked co-fired layers of ceramic material;

applying a bonding metal layer on top of said exposed electrical conductors at the locations of said leads and being of said same metal as the metal of said conductor patterns, devoid of said one or more additives so as to enhance bondability of the leads thereon; and, bonding the leads to said bonding metal layer at said predetermined locations.

5. The method according to claim 4 wherein the step of applying a bonding metal layer comprises applying the bonding metal layer to said electrical conductors only at said predetermined locations of said leads.

6. The method according to claim 4 wherein:

said electrical conductors are comprised of a gold paste including additives selected from a group of materials including copper, bismuth and glass; and, said bonding metal layer is comprised of a pure gold paste devoid of said additives.

7. The method according to claim 4 wherein one or more of said plurality of layers of co-fired ceramic material include respective cavities and the method further comprises:

locating at least one of said electrical conductors on at least one of said plurality of stacked co-fired layers of ceramic material below a top layer of said plurality of stacked co-fired layers of ceramic material; and, exposing predetermined ones of said electrical conductors through said cavities for bonding said leads to said bonding metal layer applied to said electrical conductors.

8. The method according to claim 4 wherein the ceramic material comprises low temperature co-fired ceramic (LTCC) material.

9. A method of making a co-fired multi-layer laminate structure comprising the steps of:

stacking a plurality of co-fired layers of a predetermined type of ceramic material including metallization in predetermined conductor patterns on and through said plurality of stacked co-fired layers, wherein said conductor patterns include a plurality of electrical conductors including leads;

exposing said plurality of electrical conductors including said leads from said conductor patterns at predetermined locations on said plurality of stacked co-fired layers, said electrical conductors being comprised of a metal paste including one or more additives to promote adhesion to said plurality of stacked co-fired layers of ceramic material;

applying a bonding metal layer on top of said exposed electrical conductors at the locations of said leads and being of said same metal as the metal of said conductor patterns, devoid of said one or more additives so as to enhance bondability of the leads thereon;

bonding the leads to said bonding metal layer at said predetermined locations; and, wherein said electrical conductors are comprised of a gold paste including additives selected from a group of materials including copper, bismuth and glass, and said bonding metal layer is comprised of a pure gold paste devoid of said additives.

10. The method according to claim 9 wherein the step of applying a bonding metal layer comprises applying the bonding metal layer to the electrical conductors prior to a step of first co-firing said plurality of stacked co-fired layers of ceramic material and then co-firing the bonding metal layer together with said plurality of stacked co-fired layers of ceramic material or wherein the step of applying the bonding metal layer comprises applying and post firing the bonding metal layer to the electrical conductors fired after said first step of co-firing of said plurality of stacked co-fired layers of ceramic material.

11. The method according to claim 9 and wherein the step of applying a bonding metal layer comprises applying the bonding metal layer to the electrical conductors prior to a step of first co-firing said plurality of stacked co-fired layers of ceramic material and then co-firing the bonding metal layer together with said plurality of stacked co-fired layers of ceramic material.

12. The method according to claim 9 and wherein the step of applying the bonding metal layer comprises applying and post firing the bonding metal layer to the electrical conductors fired after said first step of co-firing of said plurality of stacked co-fired layers of ceramic material.

\* \* \* \* \*